US005801083A

United States Patent [19]
Yu et al.

[11] Patent Number: 5,801,083
[45] Date of Patent: Sep. 1, 1998

[54] USE OF POLYMER SPACERS FOR THE FABRICATION OF SHALLOW TRENCH ISOLATION REGIONS WITH ROUNDED TOP CORNERS

[75] Inventors: Bo Yu; Qing Hua Zhong; Jian Hui Ye; Mei Sheng Zhou, all of Singapore, Singapore

[73] Assignee: Chartered Semiconductor Manufacturing, Ltd., Singapore, Singapore

[21] Appl. No.: 954,046

[22] Filed: Oct. 20, 1997

[51] Int. Cl.⁶ .................................................. H01L 21/76
[52] U.S. Cl. ........................ 438/424; 438/435; 438/701; 438/978; 148/DIG. 161; 148/DIG. 50
[58] Field of Search ........................ 438/424, 435, 438/296, 221, 701, 978; 148/DIG. 161, DIG. 50

[56] References Cited

U.S. PATENT DOCUMENTS

| | | | |
|---|---|---|---|
| 4,613,400 | 9/1986 | Tam et al. | 156/643 |
| 4,707,218 | 11/1987 | Giammarco et al. | 156/643 |
| 4,855,017 | 8/1989 | Douglas | 438/701 |
| 5,084,408 | 1/1992 | Baba et al. | 438/978 |
| 5,342,481 | 8/1994 | Kadomura | 156/659.1 |
| 5,670,401 | 9/1997 | Tseng | 438/305 |
| 5,683,908 | 11/1997 | Miyashita | 438/430 |
| 5,719,085 | 2/1998 | Moon et al. | 438/424 |

FOREIGN PATENT DOCUMENTS

| | | |
|---|---|---|
| 63-110746 | 5/1988 | Japan . |
| 1-248523 | 10/1989 | Japan . |

*Primary Examiner*—Trung Dang
*Attorney, Agent, or Firm*—George O. Saile; Stephen B. Ackerman

[57] ABSTRACT

A method for forming insulator filled, shallow trench isolation regions, with rounded corners, has been developed. The process features the use of a polymer coated opening, in an insulator layer, used as a mask to define the shallow trench region in silicon. After completion of the shallow trench formation the polymer spacers are removed, exposing a region of unetched semiconductor, that had been protected by the polymer spacers, during the shallow trench dry etching procedure. The sharp corner, at the intersection between the shallow trench and the unetched region of semiconductor, is then converted to a rounded corner, via thermal oxidation of exposed silicon surfaces. The polymer spacers also eliminate the top corner wraparound.

16 Claims, 4 Drawing Sheets

USE OF POLYMER SPACERS FOR THE FABRICATION OF SHALLOW TRENCH ISOLATION REGIONS WITH ROUNDED TOP CORNERS

BACKGROUND OF THE INVENTION

(1) Field of the Invention

The present invention relates to a method of forming isolation regions, for semiconductor devices, and more specifically to a method of creating an insulator filled shallow trench, with rounded top corners and minimized top corner wraparound.

(2) Description of Prior Art

The semiconductor industry is continually striving to improve performance of semiconductor products, while still reducing or maintaining the cost of these same semiconductor products. These objectives have been successfully addressed via micro-miniaturization, or the ability to fabricate semiconductor devices using sub-micron features. The smaller device features result in reductions in performance degrading resistances and capacitances, while also allowing levels of integration, previously obtained only with larger counterparts, now able to be realized with smaller semiconductor chips. The use of smaller chips results in more semiconductor chips to be realized from a specific size starting substrate, thus reducing the manufacturing costs for a specific semiconductor chip.

Micro-miniaturization has been accomplished via advances in specific semiconductor fabrication disciplines, such as photolithography and dry etching. The use of more advanced exposure tools, as well as the development of more sensitive photoresist materials, have allowed sub-micron images in photoresist layers to be routinely obtained. Similar advances in the dry etching discipline have allow the successful the sub-micron images in photoresist layers to be successfully transferred to underlying materials, used for the fabrication of semiconductor devices. However, in addition to advances in fabrication disciplines, semiconductor devices have benefitted from structural enhancements, such as the use of insulator filled, shallow trench isolation, (STI), regions. STI regions, used for isolation between specific device elements or device regions, consumes less area, then previously used, thermally grown, field oxide, (FOX), regions. The ability to form shallow trenches in a silicon substrate, via photolithographic and dry etching procedures, followed by insulator filling of the shallow trenches, has allowed smaller semiconductor chips to be realized. However the abrupt, wraparound top corners of the shallow trenches, formed via anisotropic dry etching procedures, can create stress points, as well as parasitic parallel devices, resulting in possible device leakage problems.

This invention will describe a process for forming STI regions, with rounded corners, thus decreasing the risk of leakage related yield losses. The rounded corners are obtained via formation of a polymer layer, during an initial phase of the STI patterning procedure, first resulting in a sharp cornered, silicon shape, exposed between masking layers and a shallow trench. A subsequent oxidation procedure converts the sharp cornered silicon shape, exposed only between masking layers, and a shallow trench, to a rounded cornered, silicon shape. Prior art, such as Giammarco, et al, in U.S. Pat. No. 4,707,218, describe the use of a polymer layer, on the side of an opening in a photoresist shape, decreasing the dimension of the opening. The reduced opening image is then transferred to an underlying material via anisotropic, reactive ion etching, (RIE), procedures. However that art does not use a polymer layer to expose a sharp corned silicon shape, nor does this prior art use an oxidation procedure to convert the sharp cornered silicon shape, to a round cornered silicon shape.

SUMMARY OF THE INVENTION

It is an object of this invention to create insulator filled, shallow trench isolation regions, in a semiconductor substrate.

It is another object of this invention to form shallow trenches in a semiconductor substrate, with rounded corners.

It is still another object of this invention to protect a region of silicon, adjacent to the shallow trench, from the shallow trench etching procedure, via use of a polymer layer, or polymer spacer, on the sides of the opening in an insulator layer, used as a mask for shallow trench patterning.

It is yet another object of this invention to thermally grow silicon oxide, on a region of the shallow trench, protected during the shallow trench etching by a polymer spacer, resulting in shallow trenches with rounded corners.

In accordance with the present invention a process for creating shallow trench isolation regions, with rounded corners, is described. A photoresist shape is used as a mask to create an opening in a silicon nitride layer, and an underlying pad oxide layer, on a semiconductor substrate, via anisotropic reactive ion etching procedures. A polymer spacer is formed on the exposed sides of the opening in the photoresist shape, the silicon nitride layer, and the pad oxide layer. Shallow trenches are formed in the semiconductor substrate, via dry etching procedures, using the polymer coated opening as a mask. Removal of the photoresist mask, and the polymer spacer, expose a region of unetched silicon, protected from the shallow trench etching procedure by the polymer spacer, with the unetched silicon exhibiting sharp corners in regions in which the unetched silicon meets the shallow trench. A thermal oxidation procedure is used to form a shallow trench oxide liner layer, on the exposed shallow trench surfaces, and on the unetched silicon, converting the sharp corner, at the unetched silicon—shallow trench intersection, to a rounded corner. Filling of the shallow trenches with insulator material is followed by removal of unwanted insulator material, on the top surface of the masking silicon nitride layer, via chemical mechanical polishing procedures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating insulator filled, shallow trench isolation, (STI), regions, will now be described in detail. The STI regions, described in this invention, can be used to provide the needed isolation for metal oxide semiconductor field effect transistor, (MOSFET), such as N channel, (NFET), P channel, (PFET), complimentary, (CMOS), or BiCMOS devices.

Figure 1:
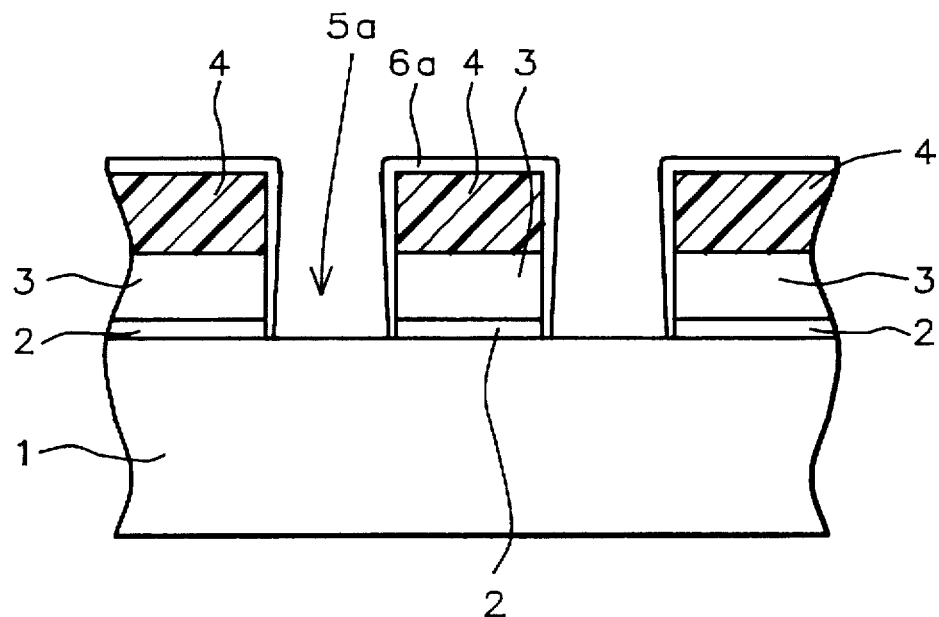
FIGS. 1–8, which schematically, in cross-sectional style, show the stages of fabrication used to create insulator filled, shallow trench isolation regions, with rounded corners.

A semiconductor substrate 1, comprised of single crystalline silicon, with a <100> crystallographic orientation is used, and shown schematically in FIG. 1. A pad oxide layer 2, of silicon oxide, is formed on semiconductor substrate 1, at a thickness between about 50 to 200 Angstroms, via thermal oxidation procedures. A silicon nitride layer 3, is next deposited, using either low pressure chemical vapor deposition, (LPCVD), or plasma enhanced chemical vapor deposition, (PECVD), procedures, to a thickness between about 1000 to 2000 Angstroms. Finally photoresist shape 4, with opening 5a, is formed on silicon nitride layer 3, with opening 5a, being greater than 2000 Angstroms. An anisotropic RIE procedure, using $CF_4$—$CHF_3$—Ar as an etchant for silicon nitride layer 3, and using $CHF_3$—$CF_4$—Ar—CO as an etchant for pad oxide layer 2, is used to transfer opening 5a, in photoresist layer 4, to the underlying insulator layers. A thin polymer layer 6a, is formed on the top of photoresist shape 4, as well as on the sides of opening 5a. The thickness of polymer layer 6a, on the sides of opening 5a, is thicker at the top than at the bottom of opening 5a, with the thickness of polymer layer 6a, only between about 25 to 50 Angstroms on the sides of the bottom of opening 5a. The result of these steps are schematically displayed in FIG. 1.

Figure 2:
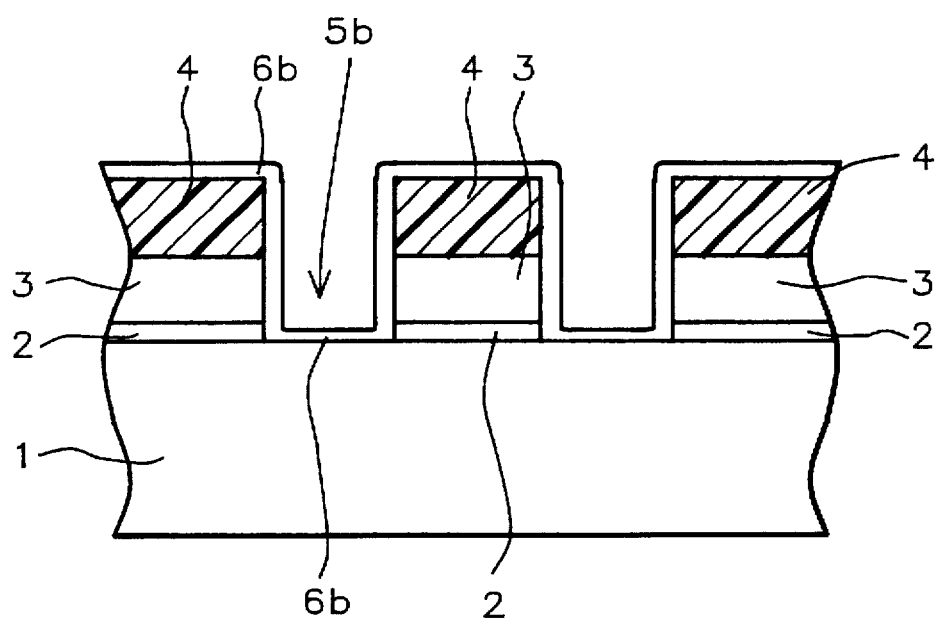
Figure 3:
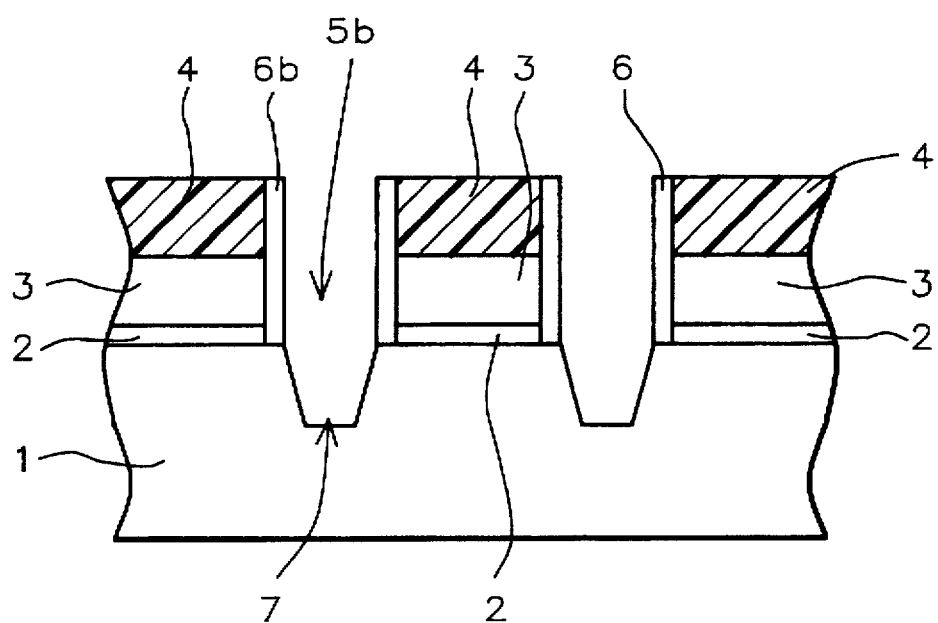
Figure 4:
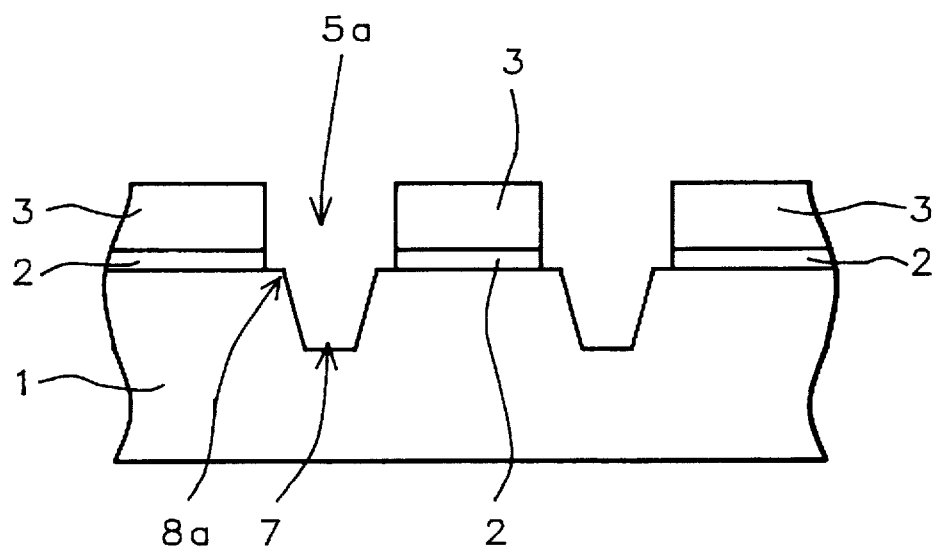

A thicker polymer layer 6b, or polymer spacer, is next formed on the exposed sides of opening 5a, forming opening 5b. Polymer layer 6b, consisting of fluorinated hydrocarbons, is formed during an over etch cycle, after the completion of opening 5a, using $CHF_3$—$CF_4$—Ar—CO. Polymer layer 6b, or polymer spacers, formed on the sides of opening 5a, have a thickness between about 200 to 500 Angstroms, while polymer layer 6, on the top surface of photoresist shape 4, and on the exposed surface of semiconductor substrate 1, in opening 5b, is thinner, resulting from the exposure of these surfaces to the ion bombardment experienced during the over etch cycle. This is schematically shown in FIG. 2. A shallow trench 7, is next formed in semiconductor substrate 1, via a RIE procedure, using either HBr—$Cl_2$—$O_2$, or $Cl_2$—$O_2$, as an etchant, to a depth between about 1500 to 4000 Angstroms. The "sloped" or "tapered" trench, exhibiting a profile angle between about 70° to 90°, is controlled by the etching conditions used such as gas ratio, pressure, and bias. This is schematically shown in FIG. 3. Photoresist shape 4, as well as polymer layer 6b, are removed via plasma oxygen ashing procedures, resulting in the shallow trench schematically shown in FIG. 4. A region of unetched semiconductor substrate, masked from the shallow trench RIE procedure by polymer spacer 6b, creates a sharp corner 8a, at the interface between shallow trench 7, and the region of unetched semiconductor substrate. The width of the region of unetched semiconductor substrate is equal to the thickness of the polymer spacers, between about 200 to 500 Angstroms, that previously existed on the sides of opening 5a. Sharp corner 8a, can present a point of high stress, resulting in possible yield and reliability problems, for the completed devices.

Figure 5:
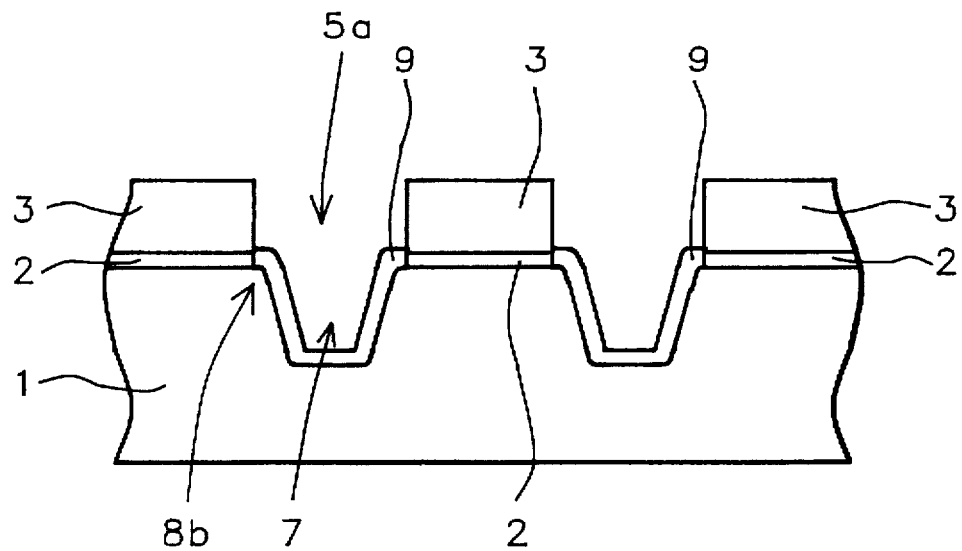

The result of a procedure used to reduce the severity of the sharp corner 8a, is schematically shown in FIG. 5. A thermal oxidation procedure, in dry oxygen, or in an oxygen-steam ambient, with HCl, is performed at a temperature between about 850° to 1100° C., resulting in the creation of silicon dioxide layer 9, between about 100 to 200 Angstroms, on the exposed silicon surfaces of shallow trench 7, as well as on the exposed surface of region of unetched semiconductor substrate. The top corner 8a, is now converted to a rounded corner 8b, reducing the stress at this interface.

Figure 6:
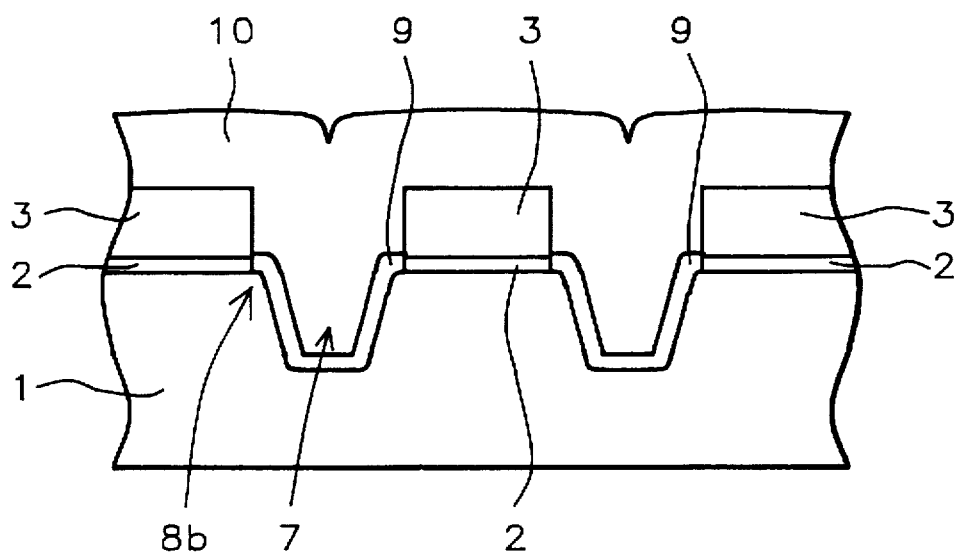
Figure 7:
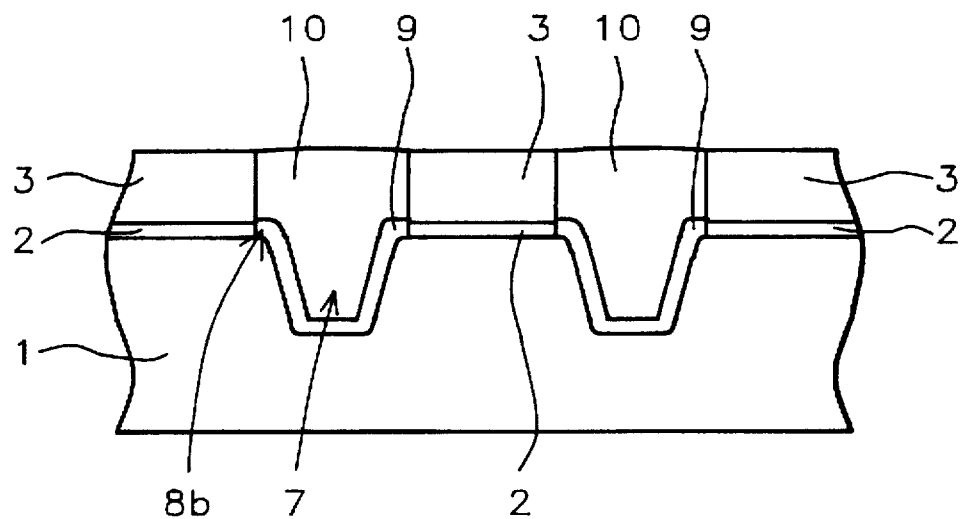
Figure 8:
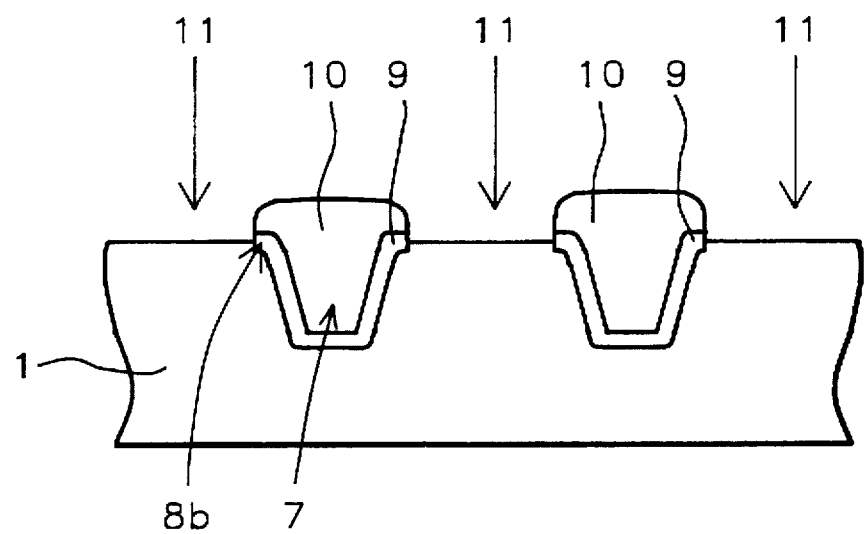

Shallow trench 7, now exhibiting rounded corners 8b, lined with silicon dioxide layer 9, is now filled with silicon oxide layer 10. Silicon oxide layer 10, is obtained via use of either LPCVD, sub-atmospheric pressure chemical vapor deposition, (SACVD), high density plasma chemical vapor deposition, (HDPCVD), or atmospheric pressure chemical vapor deposition, (APCVD), procedures, using tetraethylorthosilicate, (TEOS), or silane and oxygen, as a source, to a thickness between about 4000 to 7000 Angstroms. This is schematically shown in FIG. 6. Removal of unwanted silicon oxide layer 10, on the top surface of silicon nitride layer 3, is removed via chemical mechanical polishing procedures, using silicon nitride layer 3, as a stop layer. This can be seen in FIG. 7. Silicon nitride layer 3, is then removed using a hot phosphoric acid solution, followed by a buffered hydrofluoric acid procedure, used to remove pad oxide layer 2. These wet etch procedures result in the STI structure, comprised of shallow trenches, in semiconductor substrate 1, with rounded corners 8b, filled with silicon oxide layer 10. This is schematically shown in FIG. 8. Regions 11, located between STI structures, can now be used to fabricate the desired MOSFET devices.

While this invention has been particularly shown and described with reference to the preferred embodiments thereof, it will be understood by those skilled in the art that various changes in form and details may be made without departing from the spirit and scope of this invention.

What is claimed is:

1. A method for creating an insulator filled, shallow trench isolation region, in a semiconductor substrate, comprising the steps of:

depositing a first insulator layer on said semiconductor substrate;

forming an opening in said first insulator layer, exposing said semiconductor substrate;

forming polymer spacers on the sides of said opening, creating a polymer coated opening;

creating a shallow trench in said semiconductor substrate, in a region exposed in said polymer coated opening;

removing said polymer spacers, exposing a region of unetched semiconductor substrate, located between said first insulator layer and said shallow trench;

growing a silicon dioxide layer on exposed silicon surfaces of said shallow trench, and on said region of unetched semiconductor substrate; and filling said shallow trench with a second insulator layer.

2. The method of claim 1, wherein said first insulator layer is a composite insulator layer, comprised of an overlying silicon nitride layer, between about 1000 to 2000 Angstroms, in thickness, on an underlying silicon oxide layer, between about 50 to 200 Angstroms, in thickness.

3. The method of claim 1, wherein said opening, in said first insulator layer, is formed via anisotropic RIE procedures, using $CHF_3$—$CF_4$—Ar as an etchant for a silicon nitride layer, and using $CHF_3$—$CF_4$—Ar—CO as an etchant for a silicon oxide layer.

4. The method of claim 1, wherein said polymer spacers are formed on the sides of said opening, to a thickness between about 200 to 500 Angstroms, via a RIE procedure, using $CHF_3$—$CF_4$—Ar—CO.

5. The method of claim 1, wherein said polymer coated opening is used as a mask to create said shallow trench, in said semiconductor substrate, to a depth between about 1500 to 4000 Angstroms, via a RIE procedure, using either HBr—$Cl_2$—$O_2$, or $Cl_2$—$O_2$, as an etchant, with the shallow trench shape exhibiting a profile between about 70° to 90°.

6. The method of claim 1, wherein said unetched region of said semiconductor substrate, is between about 200 to 500 Angstroms, in width.

7. The method of claim 1, wherein said silicon oxide layer, formed on the exposed silicon surfaces of said shallow trench, and on the surface of said region of unetched semiconductor substrate, is obtained via thermal oxidation, in dry oxygen, or in an oxygen-steam ambient, with HCl, at a temperature between about 850° to 1100° C., to a thickness between about 100 to 200 Angstroms.

8. The method of claim 1, wherein said second insulator layer, used to fill said shallow trench, is a silicon oxide layer, obtained using LPCVD, APCVD, SACVD, or HPCVD procedures, to a thickness between about 4000 to 7000 Angstroms, using TEOS as a source.

9. A method for forming an insulator filled, shallow trench isolation region, with rounded corners, in a semiconductor substrate, comprising the steps of:

depositing a composite insulator layer, on said semiconductor substrate;

forming a photoresist shape, with a first opening, on said composite insulator layer;

anisotropic etching of said composite insulator layer, using said photoresist shape as a mask, extending said first opening in said photoresist shape, to said composite insulator layer;

forming polymer spacers on the sides of said first opening in said photoresist shape, and on the sides of said first opening in said composite insulator layer, creating a polymer coated opening;

dry etching of said semiconductor substrate, exposed in polymer coated opening, creating shallow trench regions;

removal of said photoresist shape, and of said polymer spacers, exposing a region of unetched semiconductor substrate, between said shallow trench and said composite insulator layer, and exposing a sharp corner at the intersection of said shallow trench and said region of unetched semiconductor substrate; growing a silicon oxide layer on exposed surfaces of said shallow trench, and on the exposed surface of said region of unetched semiconductor substrate, converting said sharp corner, to a rounded corner, at intersection of said shallow trench and said region of unetched semiconductor substrate;

depositing an insulator layer on top surface of said composite insulator layer, completely filling shallow trench; and removing said insulator layer from the top surface of said composite insulator layer, resulting in said insulator filled, shallow trench, with rounded corners.

10. The method of claim 9, wherein said composite insulator layer is comprised of an overlying silicon nitride layer, at a thickness between about 1000 to 2000 Angstroms, and an underlying silicon oxide layer, at a thickness between about 50 to 200 Angstroms.

11. The method of claim 9, wherein said first opening in said composite insulator layer, is formed via anisotropic RIE procedures, using said photoresist shape as a mask, using $CHF_3$—$CF_4$—Ar as an etchant for a silicon nitride layer, and using $CHF_3$—$CF_4$—Ar—CO as an etchant for a silicon oxide layer.

12. The method of claim 9, wherein said polymer spacers, on the sides of said first opening, are formed to a thickness between about 200 to 500 Angstroms, via an anisotropic RIE procedure, using $CHF_3$—$CF_4$—Ar—CO.

13. The method of claim 9, wherein said shallow trench is formed in said semiconductor substrate, to a depth between about 1500 to 4000 Angstroms, via a RIE procedure, using said polymer coated opening as a mask, and using HBr—$Cl_2O_2$, or $Cl_2$—$O_2$, as an etchant.

14. The method of claim 9, wherein said region of unetched semiconductor substrate is between about 200 to 500 Angstroms, in width.

15. The method of claim 9, wherein said rounded corner, at the intersection of said shallow trench and said region of unetched semiconductor substrate, is converted from said sharp corner, via thermal oxidation of exposed silicon surfaces, creating said silicon oxide layer, at a thickness between about 100 to 200 Angstroms.

16. The method of claim 9, wherein said insulator layer, used to fill said shallow trench, is silicon oxide, deposited using LPCVD, SACVD, APCVD, or HPCVD procedures, to a thickness between about 4000 to 7000 Angstroms, using TEOS, or silane and oxygen, as a source.

* * * * *